(12) United States Patent
Liu et al.

(10) Patent No.: US 6,257,682 B1
(45) Date of Patent: Jul. 10, 2001

(54) COMPUTING CASING STRUCTURE

(75) Inventors: Alvin Liu, Pa-Li; Yu Tai Liu, Hsin-Chuang; Yun-Long Chen, Chung-Ho; Kuang-Yu Chen, Tu-Chen, all of (TW)

(73) Assignee: Hon Hai Preciosion Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/490,816

(22) Filed: Jan. 25, 2000

Related U.S. Application Data

(63) Continuation-in-part of application No. 09/126,623, filed on Jul. 30, 1998, now Pat. No. 6,102,449.

(30) Foreign Application Priority Data

Jan. 17, 1998 (TW) ................................................ 87200885

(51) Int. Cl.[7] ...................................................... H05K 7/18
(52) U.S. Cl. ..................................... 312/223.2; 312/265.6
(58) Field of Search ............................. 312/223.2, 223.1, 312/265.5, 265.6, 263, 257.1, 215, 216, 217, 218, 222; 361/724, 683; 292/116, 302, 300; 220/650, 324, 326; 403/364

(56) References Cited

U.S. PATENT DOCUMENTS

| | | | |
|---|---|---|---|
| 5,061,023 | * 10/1991 | Soubliere et al. | 312/223.1 X |
| 5,491,611 | * 2/1996 | Stewart et al. | 312/223.2 X |
| 5,825,626 | * 10/1998 | Hulick et al. | 312/223.2 X |
| 5,967,633 | * 10/1999 | Jung | 312/223.2 |
| 5,975,659 | * 11/1999 | Yang et al. | 312/223.2 |
| 6,157,532 | * 12/2000 | Cook et al. | 312/223.2 X |

* cited by examiner

Primary Examiner—Janet M. Wilkens
(74) Attorney, Agent, or Firm—Wei Te Chung

(57) ABSTRACT

A computer casing includes a side panel releasably attached thereto for covering an opening defined in a side wall thereof. The side panel has a first edge from which a perpendicular flange extends. Anchoring tabs perpendicularly extend from the flange. A step is formed on a corresponding edge of the opening with slots defined therein to receive the anchoring tabs with the flange abutting against the step thereby effectively eliminating electromagnetic radiation emitted through the opening. A plurality of locking tabs are formed on an opposite second edge of the side panel. Cutouts are defined in a rear wall of the casing corresponding to the locking tabs. A locking rod movably attached to a rear wall defines a plurality of openings corresponding to the cutouts whereby the locking tabs are allowed to extend through both the cutouts of the casing and the openings of the locking rod when the locking rod is at an unlocked position. When the locking rod is moved to a locked position, edges of the openings of the locking rod engage with notches defined in the locking tabs of the side panel thereby securing the side panel in position. A biasing spring is arranged between the locking rod and the casing for biasing the locking rod to the locked position. A handle is formed on the locking rod for manually moving the locking rod.

12 Claims, 16 Drawing Sheets

COMPUTING CASING STRUCTURE

This is a continuation-in-part application of U.S. patent application Ser. No. 09/126,623 filed on Jul. 30, 1998 which is issued as U.S. Pat. No. 6,102,449.

BACKGROUND OF THE INVENTION

1. Field of the Invention

The present invention generally relates to a computer casing, and in particular to a computer casing comprising a locking mechanism for readily securing/detaching parts of the computer to/from the casing, such as a disk drive and a side panel of the casing.

2. The Prior Art

A computer comprises electronic devices housed in a casing. The electronic devices are usually supported by cages that are fixed inside the casing by means of for example screws. Disk drives are examples that are supported by disk drive cages inside the casing. As shown in FIG. 1, a 5.25" compact disk-read only memory (CD-ROM) 100 is fixedly attached to opposite side walls 120a of a disk drive cage 120' that is in turn fixed to an outside casing 101. The CD-ROM 100 is fixed to the disk drive cage 120' by means of locking screws 180 received in holes 160 defined in the side walls 120a and threadedly engaging with mounting holes 140 defined in side walls 100a of the CD-ROM 100.

When attaching the CD-ROM 100 to the disk drive cage 120', the CD-ROM 100 must be held with one hand in order to align the holes 160 of the disk drive cage 120' with the mounting holes 140 of the CD-ROM 100. This is inconvenient during assembly and/or maintenance of the CD-ROM 100.

Referring to FIG. 2, a conventional approach to the problem is to provide a pair of guiding rails 200 fixedly attached to the side walls 100a of the CD-ROM 100. The CD-ROM 100 may be deposited into a disk drive cage 220 with the guiding rails 200 movably received in corresponding guiding grooves 260 defined in side walls 220a of the disk drive cage 220. Locking screws 250 or retaining tabs (not shown) are applied to firmly fix the CD-ROM 100 to the disk drive cage 200. Even though this suggestion provides convenience when attaching the CD-ROM 100 to the disk drive cage 200, the guiding rails 200 must be firstly attached to the side walls 100a of the CD-ROM 100 which complicates the assembly process.

As the computer evolves quickly, electronic parts thereof operate at a high frequency and emit electromagnetic radiation. The electromagnetic radiation is blocked by the computer casing. However, to effectively block the electromagnetic radiation, the electronic parts must be tightly enclosed by the casing. This makes it difficult to remove the casing during maintenance.

To overcome such a problem, the computer casing is formed with an opening shielded and covered by a detachable panel. Conventionally, the detachable panel is secured to the casing by means of bolts which is a time-consuming and laborious job. Furthermore, electromagnetic radiation may leak through gap between the side panel and the casing.

It is thus desirable to have a computer casing comprising locking mechanism which facilitates efficient assembly of disk drive cages and side panels to a computers casing.

SUMMARY OF THE INVENTION

Accordingly, an object of the present invention is to provide a locking mechanism of a computer casing for facilitates mounting/removing parts of the computer to/from the casing.

A further object of the present invention is to provide a computer casing comprising a locking mechanism for facilitating efficient assembly of parts of the computer.

Another object of the present invention is to provide a computer casing capable of effectively eliminating electromagnetic radiation from the computer.

A further object of the present invention is to provide a computer casing capable of facilitating efficient assembly thereof while effectively eliminating electromagnetic radiation.

To achieve the above objects, a computer casing in accordance with the present invention comprises a side panel releasably attached thereto for covering an opening defined in a side wall thereof. The side panel has a first edge from which a perpendicular flange extends. Anchoring tabs perpendicularly extend from the flange. A step is formed on a corresponding edge of the opening with slots defined therein to receive the anchoring tabs with the flange abutting against the step thereby effectively eliminating electromagnetic radiation emitted through the opening. A plurality of locking tabs are formed on an opposite second edge of the side panel. Cutouts are defined in a rear wall of the casing corresponding to the locking tabs. A locking rod movably attached to a rear wall defines a plurality of openings corresponding to the cutouts whereby the locking tabs are allowed to extend through both the cutouts of the casing and the openings of the locking rod when the locking rod is at an unlocked position. When the locking rod is moved to a locked position, edges of the openings of the locking rod engage with notches defined in the locking tabs of the side panel thereby securing the side panel in position. A biasing spring is arranged between the locking rod and the casing for biasing the locking rod to the locked position. A handle is formed on the locking rod for manually moving the locking rod.

BRIEF DESCRIPTION OF THE DRAWINGS

The present invention will be apparent to those skilled in the art by reading the following description of the preferred embodiments thereof, with reference to the accompanying drawings, in which.

DETAILED DESCRIPTION OF THE PREFERRED EMBODIMENTS

Figure 1:
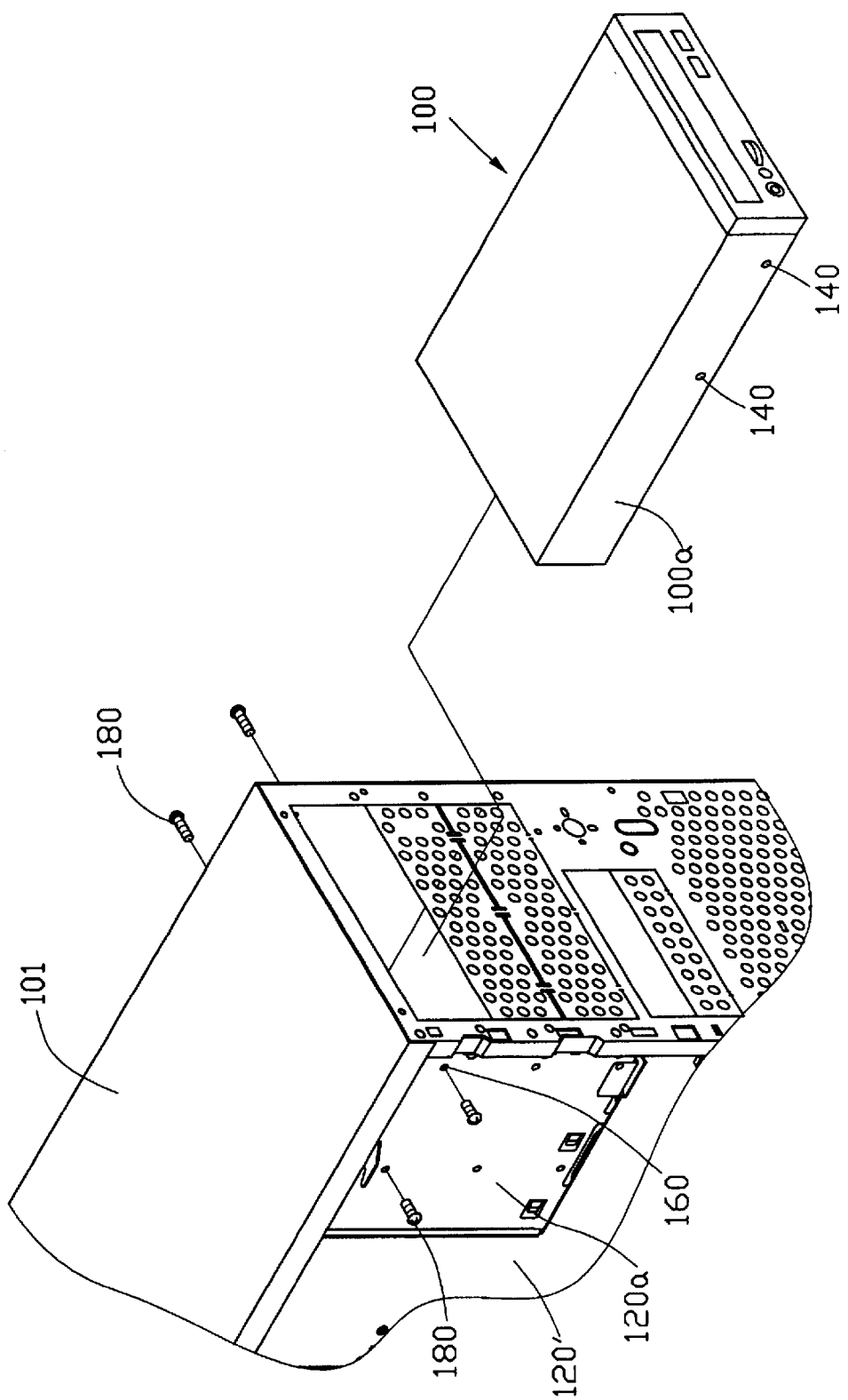
FIG. 1 is an exploded view showing a CD-ROM conventionally attached to a disk drive cage of a computer casing by means of locking screws.
Figure 2:
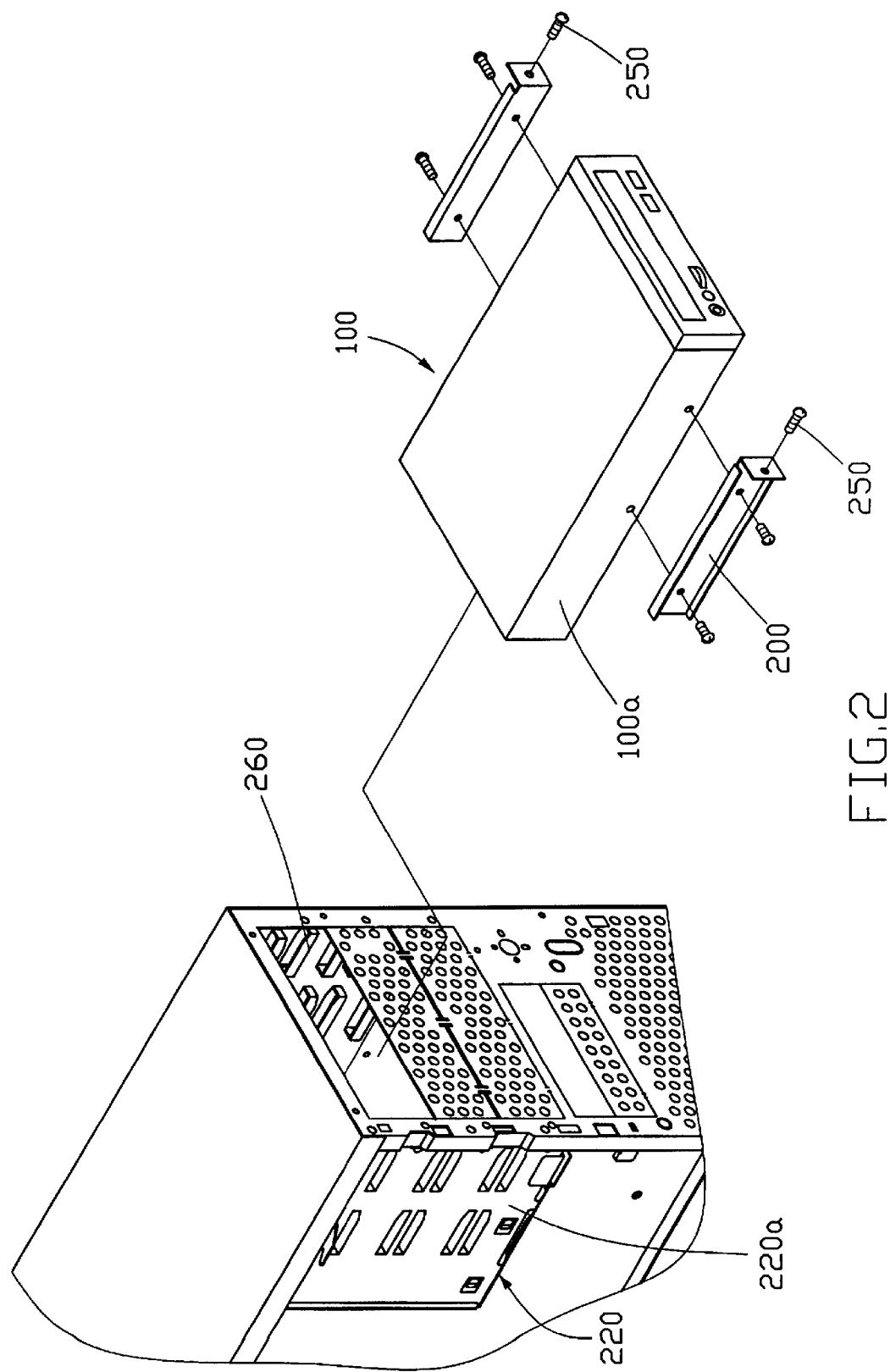
FIG. 2 is an exploded view showing a CD-ROM conventionally attached to a disk drive cage of a computer casing by means of guiding rail/groove arrangement.
Figure 3:
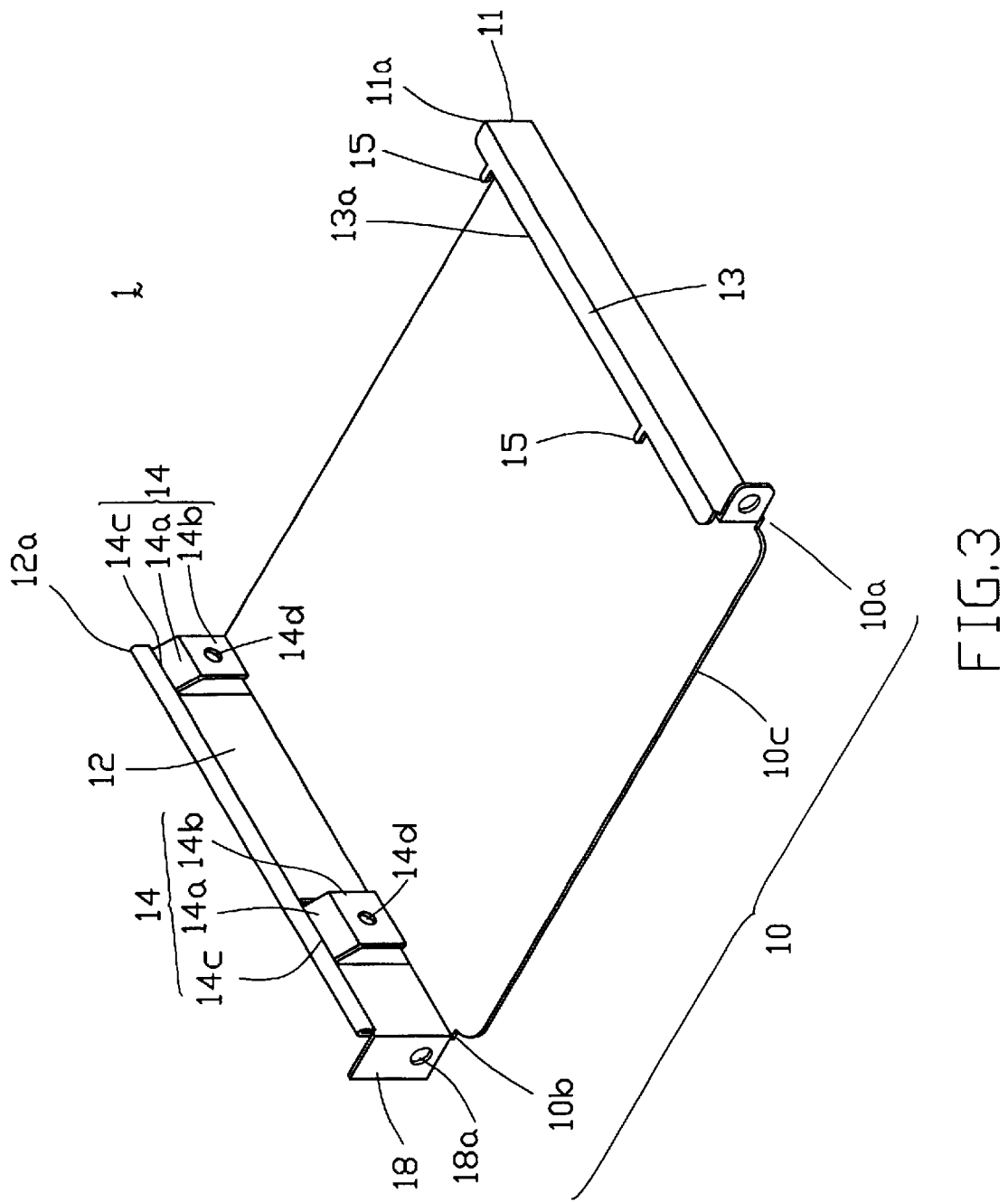
FIG. 3 is a perspective view of a mounting bracket for mounting a CD-ROM to a computer casing.

Referring to the drawings and in particular to FIG. 3, a mounting bracket 1 comprises a base plate 10 having first and second side walls 11, 12 opposite each other. The side walls 11, 12 extend vertically from sides 10a, 10b of the base plate 10. The side walls 11, 12 define a receiving space (not labeled) therebetween for receiving a CD-ROM 20 (shown in FIG. 4).

To firmly retain the CD-ROM 20 in the receiving space, the first side wall 11 forms a flange 13 extending horizontally from a free end 11a thereof. The flange 13 has a free end 13a from which dowel posts 15 extend. The posts 15 are shaped to establish an interferential engagement with corresponding holes 21 defined in the CD-ROM 20. The dowel posts 15 may be replaced with barbs for contacting and making a direct interferential engagement with an outer surface of the CD-ROM 20.

Figure 4:
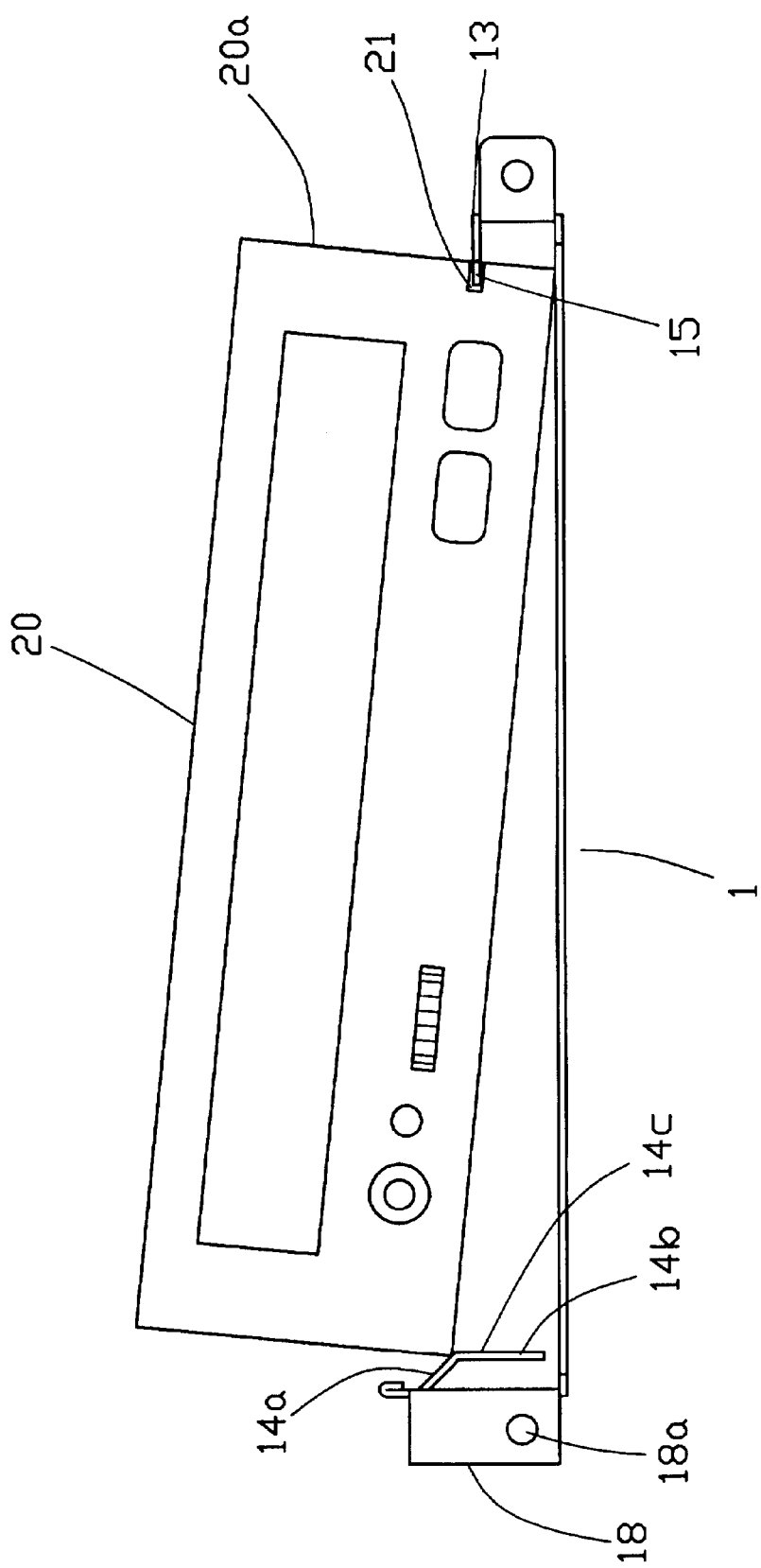
FIG. 4 is a schematic illustration showing the situation when a CD-ROM is to be retained in the mounting bracket.

The second side wall 12 forms a pair of biasing tabs 14 extending toward the receiving space 13. Each biasing tab 14 includes an inclined section 14a and a vertical section 14b parallel to the second side wall 12. In the embodiment shown in FIG. 3, each biasing tab 14 is cantilevered from a free end 12a of the second side wall 12 and the corresponding vertical section 14b may pivot about a cantilevered end 14c thereof. The receiving space between the side walls 11, 12 is reduced by the biasing tabs 14 extending inward whereby the distance between the biasing tabs 14 and the first side wall 11 is smaller than a dimension of the CD-ROM 20 as shown in FIG. 4. When the CD-ROM 20 is disposed into the receiving space, the biasing tabs 14 are deformed and apply a resilient force to the CD-ROM 20 for biasing the CD-ROM 20 to securely engage the dowel posts 15.

Figure 5:
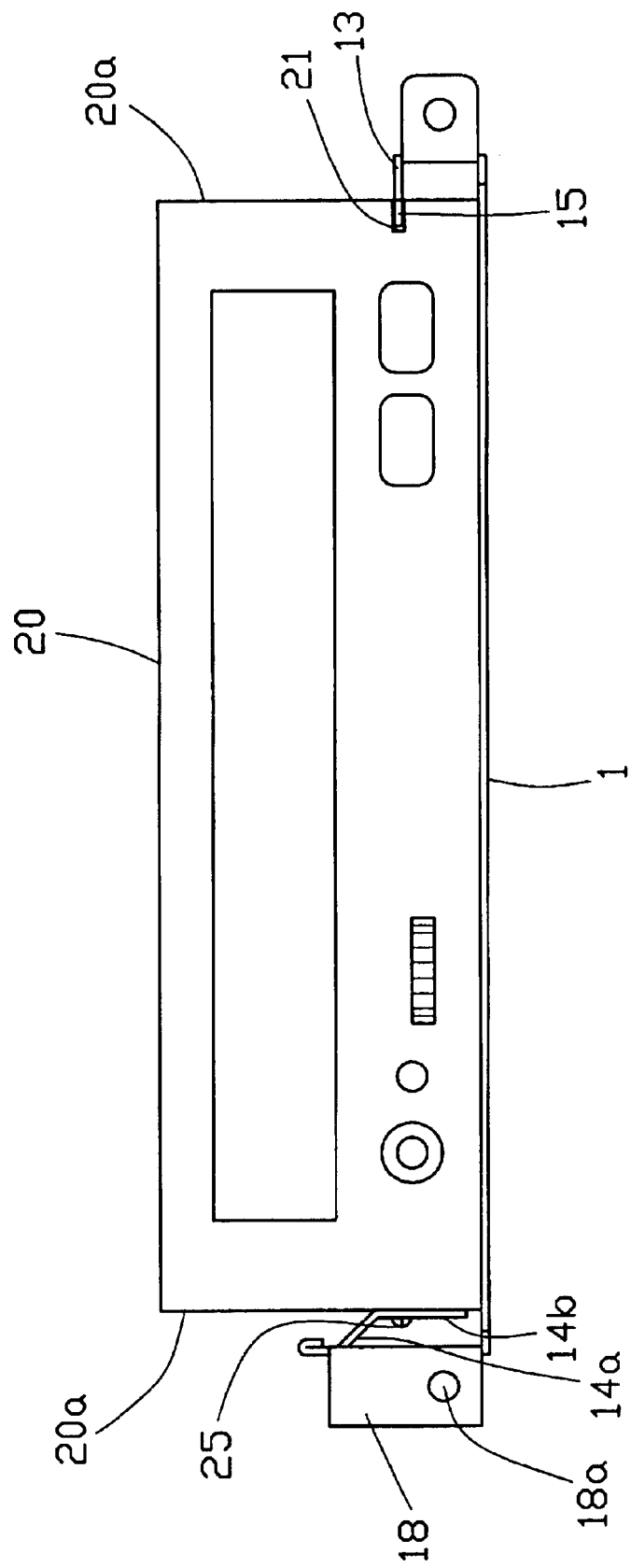
FIG. 5 is a schematic illustration showing the situation when the CD-ROM is retained in the mounting bracket.

Referring to FIGS. 4 and 5, the vertical section 14b of each biasing tab 14 defines a through hole 14d for receiving a locking screw 25 which engages with a corresponding hole (not shown) defined in the CD-ROM 20 for securing the CD-ROM 20 in the mounting bracket 1.

Figure 6:
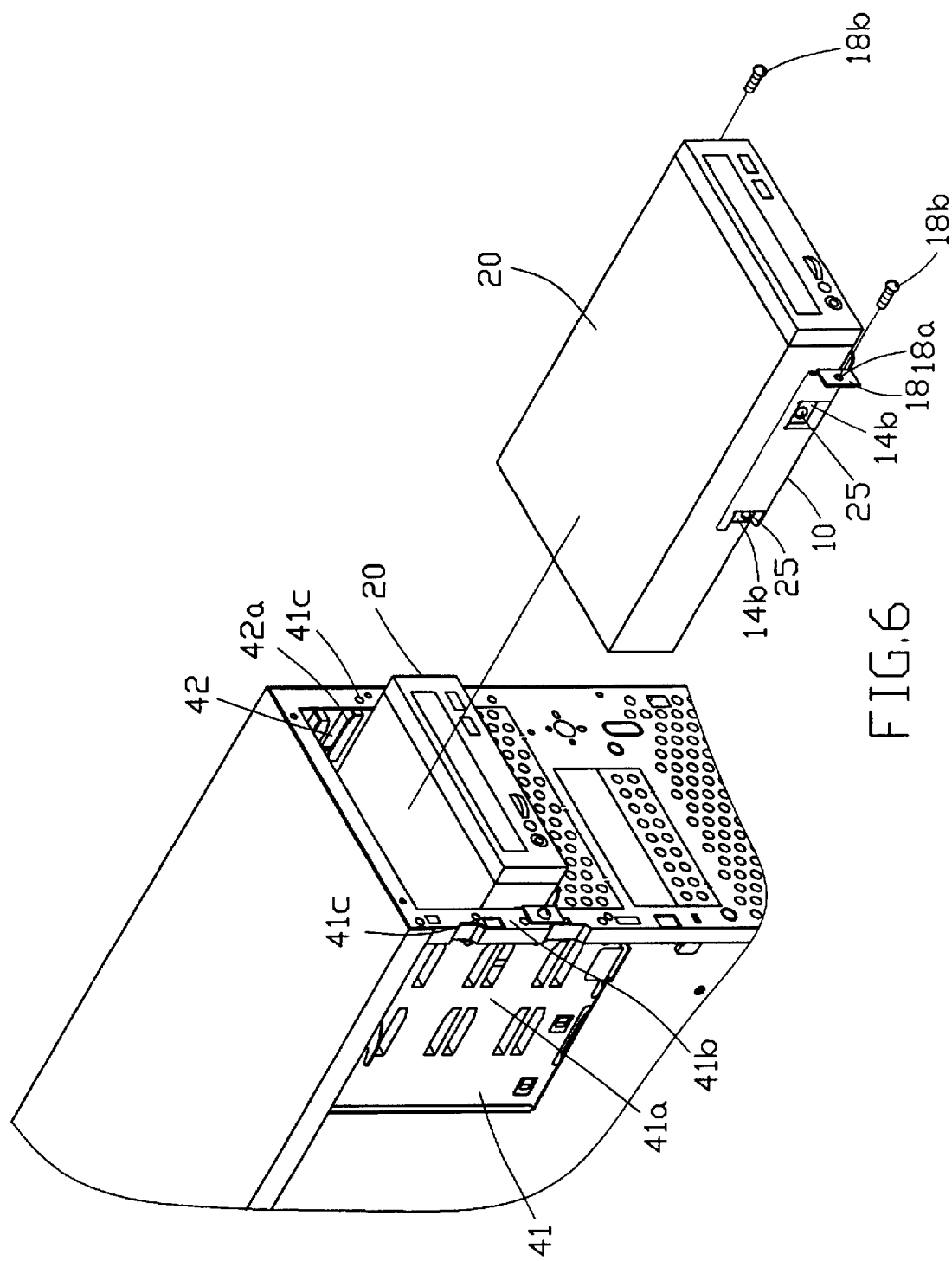
FIG. 6 is a perspective view showing a CD-ROM retained in the mounting bracket is to be deposited into a disk drive cage of a computer casing.

Referring to FIG. 6, the CD-ROM 20, secured in the mounting bracket 1, is deposited into a disk drive cage 41 mounted in a computer casing 40. The disk drive cage 41 comprises a plurality of supporting platforms 42 formed by projections 42a extending from side walls 41a of the disk drive cage 41. An underside 10c of the mounting bracket 1 is supported on the supporting platforms 42 thereby retaining the CD-ROM 20 in the computer casing 40.

The second side wall 12 of the mounting bracket 1 forms a locking tab 18 defining a locking hole 18a. A locking bolt 18b is received in the locking hole 18a and engages a mounting hole 14c defined in a front portion 41b of the disk drive cage 41 to secure the mounting bracket 1 and the CD-ROM 20 to the computer casing 40.

Figure 7:
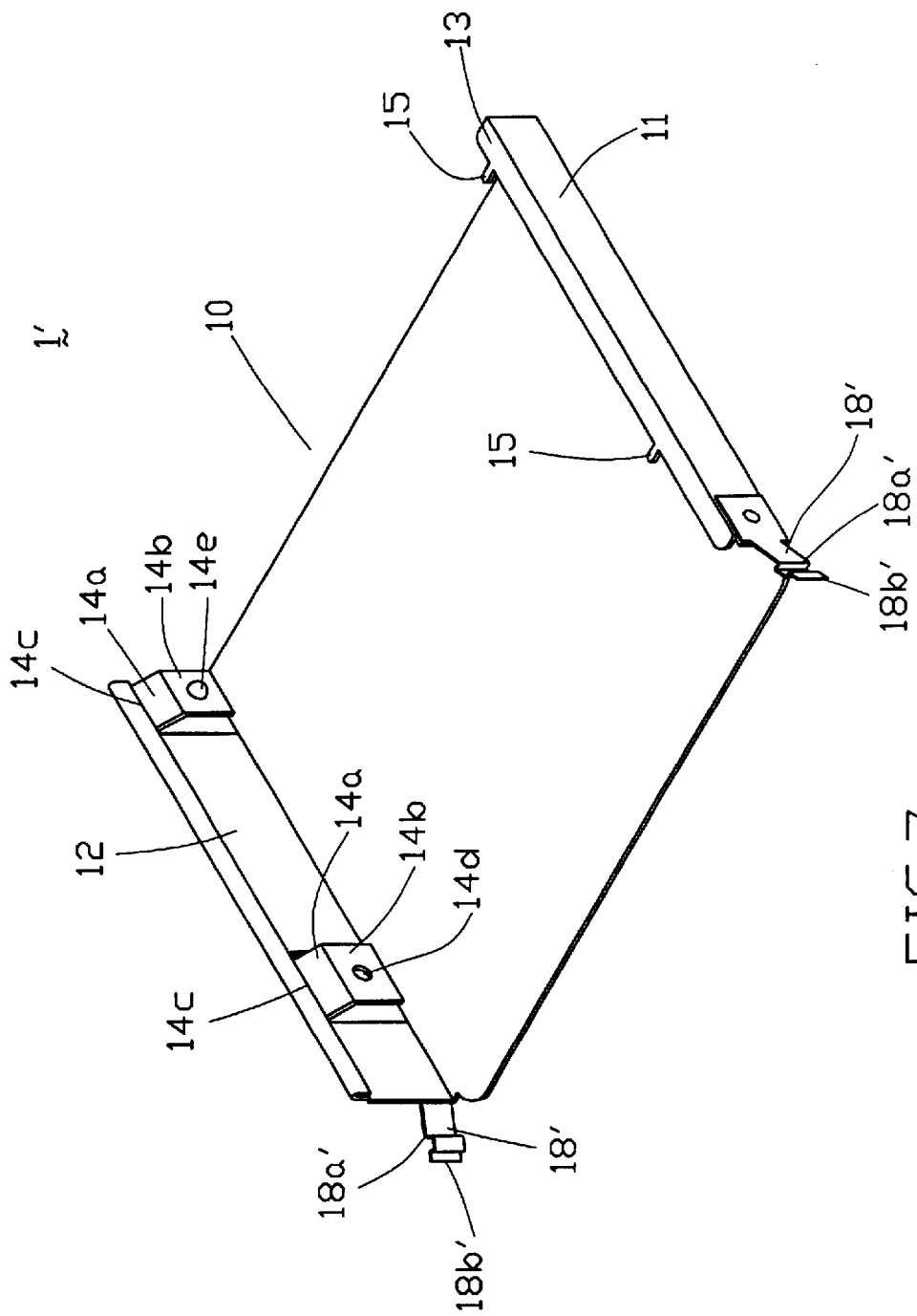
FIG. 7 is a perspective view of another mounting bracket for retaining the CD-ROM.
Figure 8:
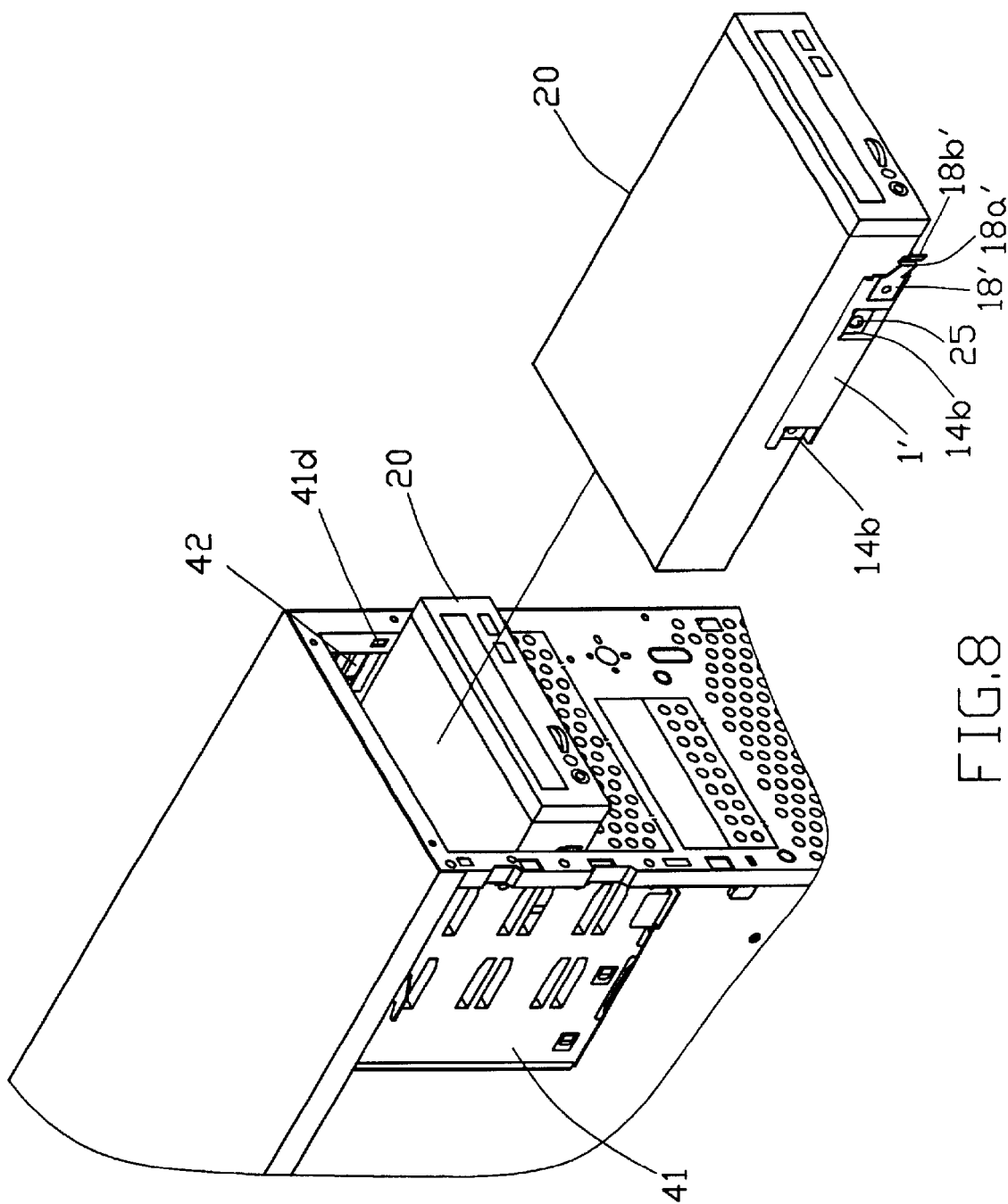
FIG. 8 is similar to FIG. 6 but showing a CD-ROM retained in the mounting bracket of FIG. 7 to be deposited into a disk drive cage of a computer casing.
Figure 9:
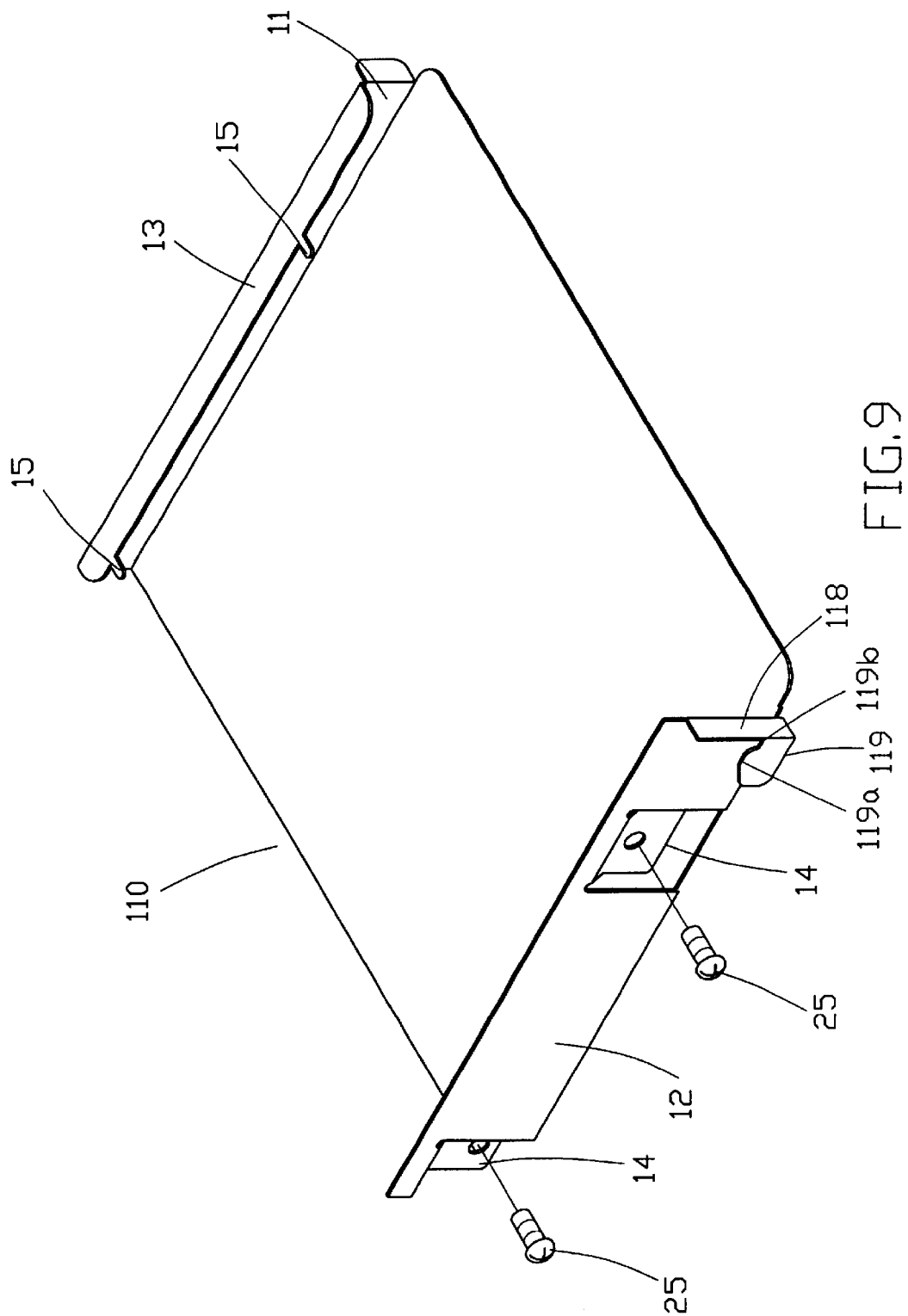
FIG. 9 is a perspective view of a further mounting bracket for retaining the CD-ROM.

Referring to FIG. 7, another embodiment of the mounting bracket, designated by reference numeral 1' for distinction, is shown, comprising a locking tab 18' which is different from the locking tab 18 of the mounting bracket 1 shown in FIGS. 3–5. The locking tab 18' extends outward and forward from each side wall 11, 12 of the mounting bracket 1' and forms a blocking shoulder 18a' and a handling portion 18b'. Also referring to FIG. 8, when a subassembly comprising a CD-ROM 20 received in the mounting bracket 1' is inserted into the disk drive cage 41 of the computer casing 40, an underside 10c of the mounting bracket 1' is supported by the supporting platforms 42 of the disk drive cage 41. The blocking shoulders 18a' engage with corresponding openings 41d defined in the disk drive cage 41 for retaining the subassembly in the disk drive cage 41.

To remove the mounting bracket 1' and the CD-ROM 20 from the disk drive cage 41, the handling portions 18b' of the locking tabs 18' are manually forced inward to release the blocking shoulders 18a' from the openings 41d thereby allowing the mounting bracket 1' to be removed from the disk drive cage 41.

In the embodiment illustrated, the through hole 14d of one of the biasing tabs 14 of the mounting bracket 1' is replaced with a retaining bud 14e which engages with a corresponding hole (not shown) defined in the CD-ROM 20 for retaining the CD-ROM 20 in position. In this respect, one of the locking screws 25 is eliminated thereby simplifying the assembly process.

It is apparent that more than one through holes 41d may be replaced by retaining bud 14e for enhancing the assembly process. In this case, the locking screws 25 may be completely removed.

FIGS. 9–12 show another embodiment of the mounting bracket, designated by reference numeral 110 for distinction. The mounting bracket 110 forms a locking tab 118 on a second side wall 12 thereof for cooperation with a locking rod 150 to releasably secure the mounting bracket 110 in the disk drive cage 41. The locking tab 118 comprises a lug section 119 extending rearward and parallel to the second side wall 12 of the mounting bracket 110. The lug section 119 forms a bump portion 119a and a retaining recess 119b for interlocking with the locking rod 150.

The locking rod 150 has an elongate body 151 having a U-shaped cross section defining a pair of side walls 152 and a bottom section 152a. The bottom section 152 defines a plurality of openings 154. The locking rod 150 comprises a mounting tail 155 at an upper portion 151a and a seat 156 for a coil spring 157 at a lower portion 151b. The locking rod 150 further comprises a handle section 158 at a bottom end 151c thereof.

The locking rod 150 is movably attached to a computer casing 140 for being movable between upper and lower positions with respect to the computer casing 140. The computer casing 140 forms a mounting tab 140a corresponding to the mounting tail 155 of the locking rod 150 and a spring socket 140b for receiving one end of the coil spring 157 of the locking rod 150. The computer casing 140 defines a plurality of cutouts 140c aligned with the openings 154 defined in the locking rod 150.

Figure 10A:
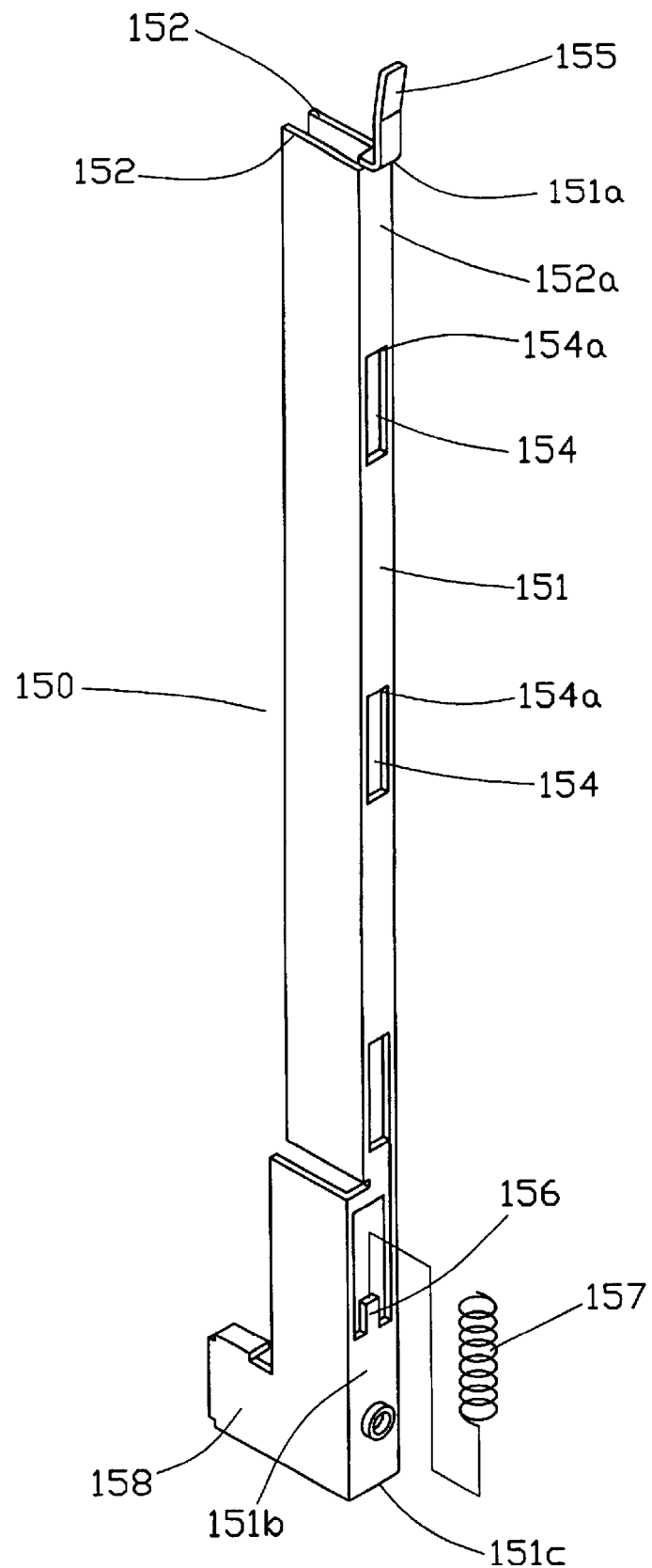
FIG. 10A is a perspective view of a locking rod mounted to a computer casing for cooperating with the mounting bracket shown in FIG. 9 to retain the CD-ROM in the computer casing.
Figure 10B:
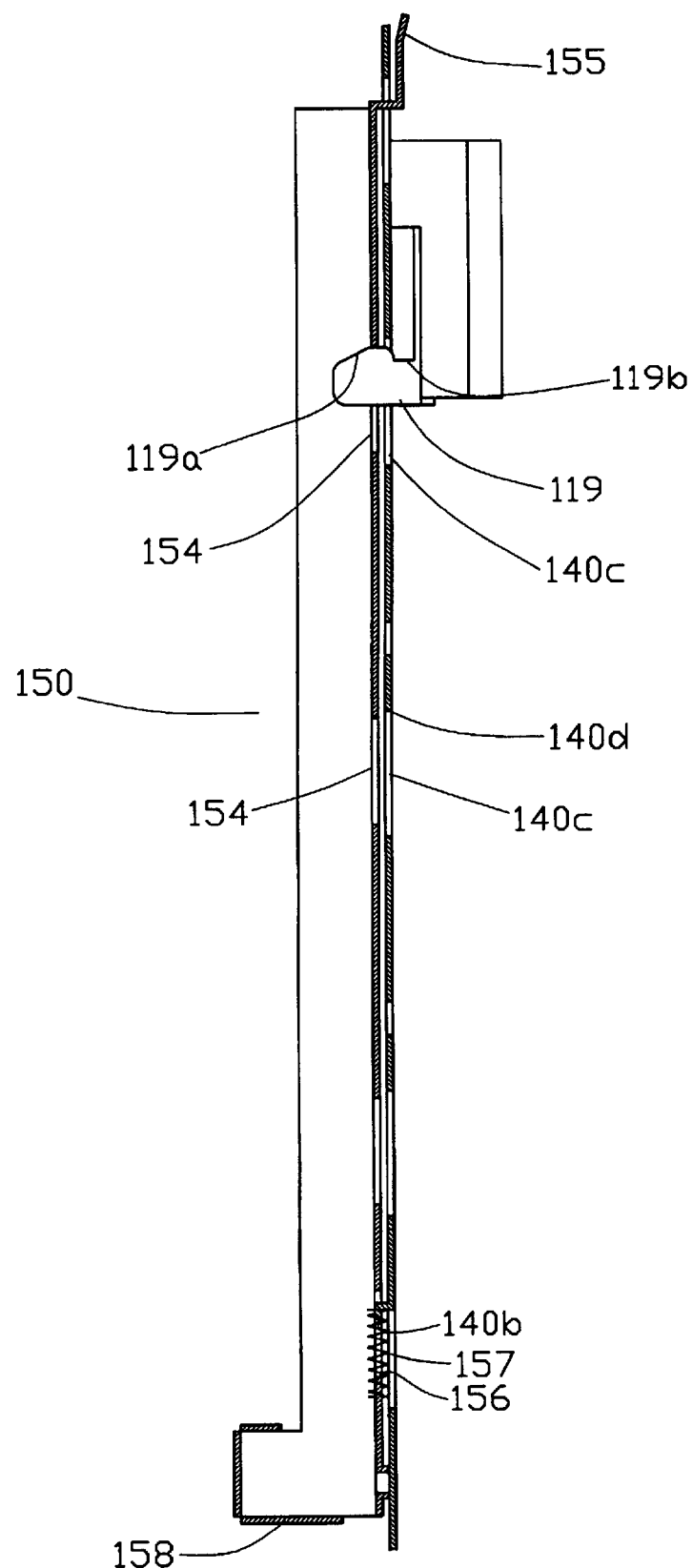
FIG. 10B is a cross-sectional view of the locking rod.
Figure 11:
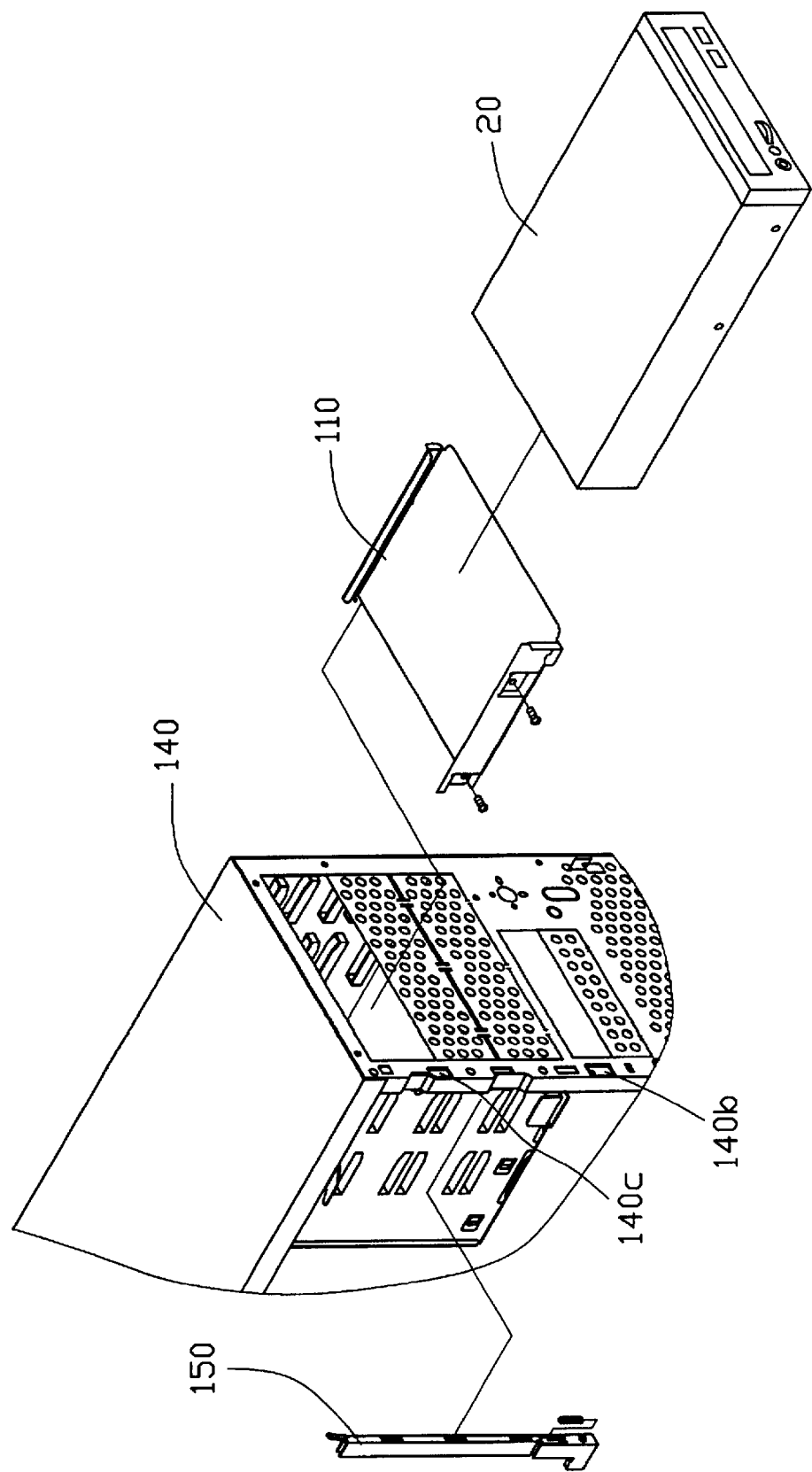
FIG. 11 is a schematic illustration of a CD-ROM retained to a disk drive cage of a computer casing by means of the locking rod and the mounting bracket of FIG. 9.
Figure 12:
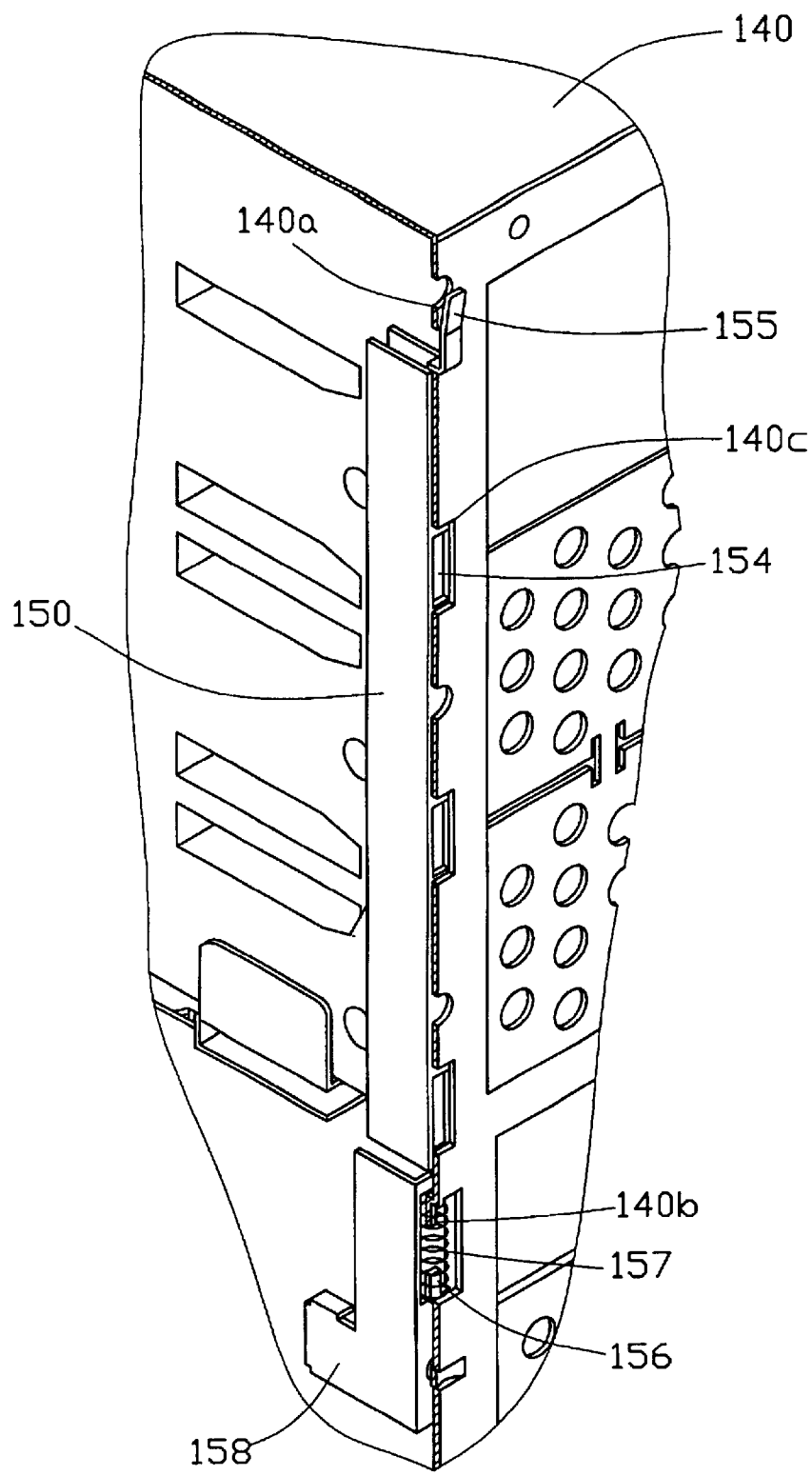
FIG. 12 is a partial cross-sectional view showing the locking rod attached to the computer casing.

The openings 154 of the locking rod 150 are smaller than the cutouts 140c of the computer casing 140 and the upper edges 154a of the openings 154 are lower than the upper edges 140d of the cutouts 140c when the locking rod 150 is biased by the coil spring 157 toward the lower position whereby by moving the locking rod 150 from the lower position to the upper position against the coil spring 157, the bump portion 119a of the locking tab 118 is allowed to selectively pass through one of the cutouts 140 and the corresponding opening 154 of the locking rod 150. The retaining recess 119b engages the upper edge 154a of the corresponding openings 154 when the locking rod 150 is biased back to the lower position by the coil spring 157 thereby securing the mounting bracket 110 (as well as the CD-ROM 20 retained therein) in position. The bump portion 119a of the locking tab 118 is provided with an inclined camming edge for facilitating insertion of the locking tab 118 into the corresponding opening 154 of the locking rod 150 as shown in FIG. 10B without manually moving the locking rod 150 to the upper position.

Figure 13:
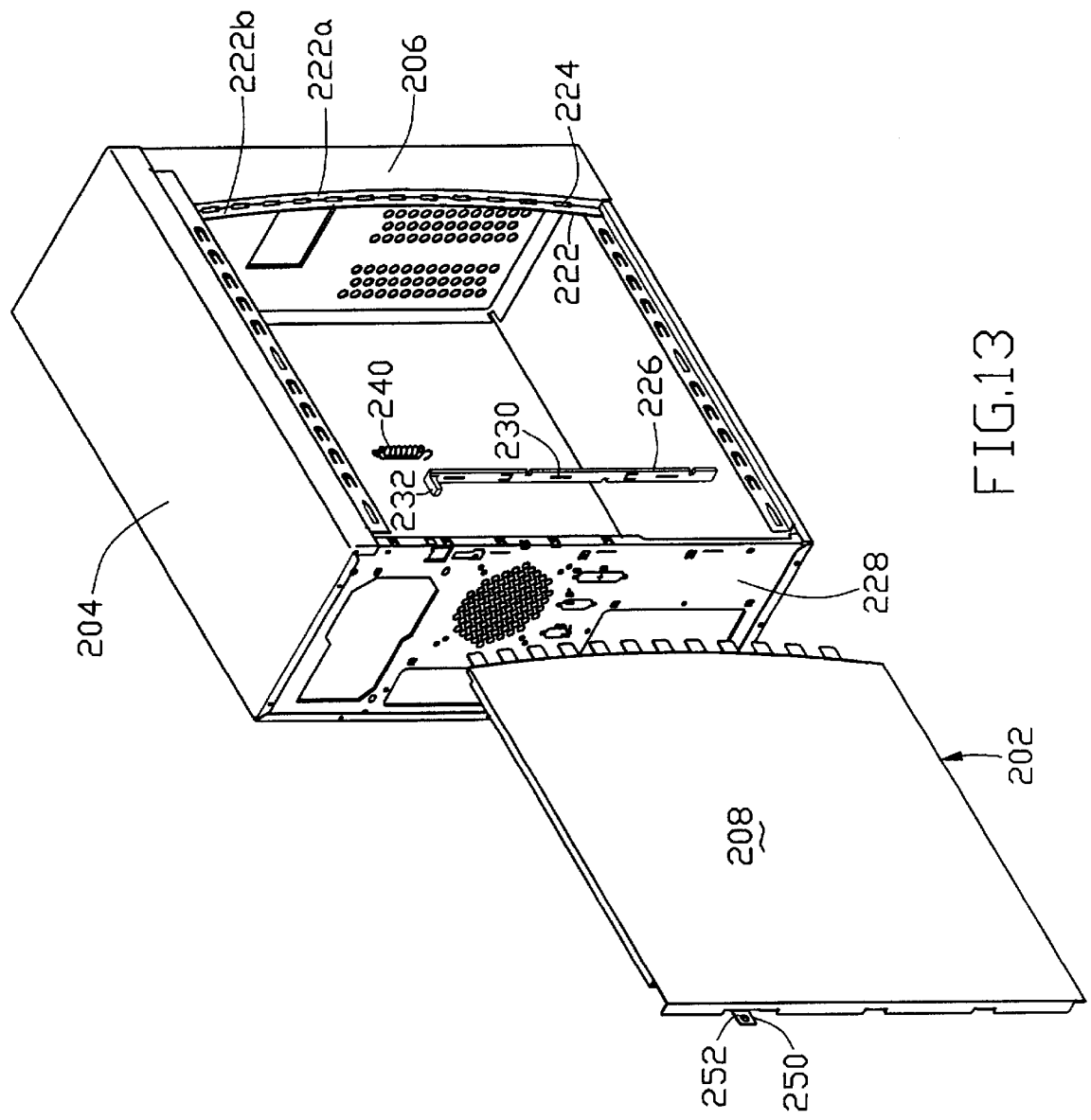
FIG. 13 is a perspective view of a computer casing with a side panel thereof detached.
Figure 14:
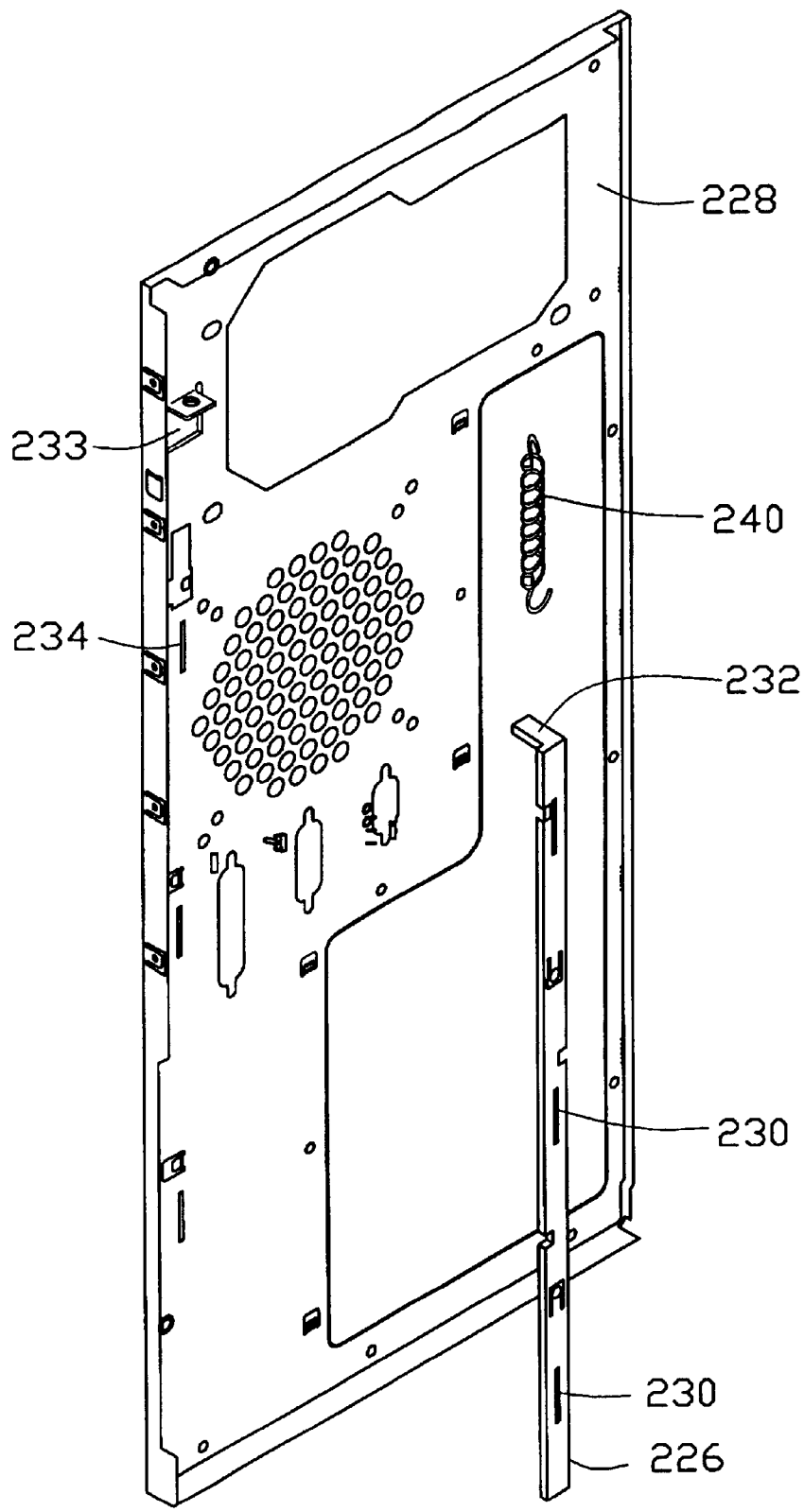
FIG. 14 is a perspective view of a rear panel of the computer casing of FIG. 13 and a locking rod to be attached to the rear panel.

FIGS. 13 and 14 show another application of the locking rod which is used to releasably secure a side panel 202 to a computer casing 204 for selectively covering an opening (not labeled) defined in a side wall 206 of the computer casing 204.

Figure 15:
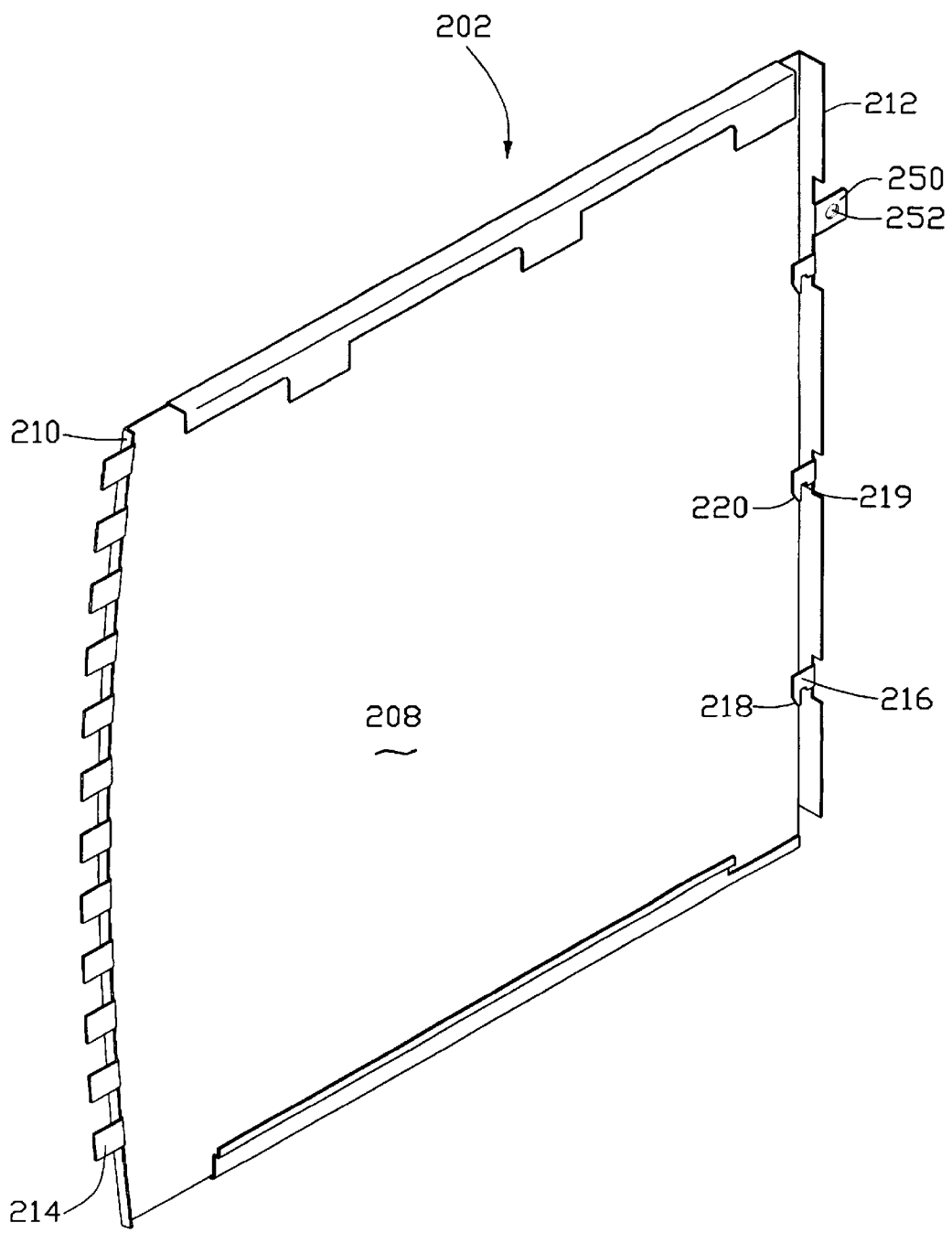
FIG. 15 is a perspective view of the side panel of the computer casing shown in FIG. 13.

Also referring to FIG. 15, the side panel 202 comprises a flat body 208 having a first side edge flange 210 and an opposite second side edge flange 212, both perpendicular to the flat body 208. The first side edge flange 210 forms a plurality of anchoring tabs 214 outwardly extending therefrom in a direction substantially perpendicular thereto whereby the anchoring tabs 214 are spaced from the flat body 208 a predetermined distance. A step-like configuration is formed between the anchoring tabs 214 and the first side edge flange 210.

The second side edge flange 212 forms a plurality of inwardly-extending locking tabs 216 substantially normal thereto. Each locking tab 216 forms a sideways-extending bump 218 having an inclined camming edge 220 that defines a retaining recess 219.

An edge of the opening defined in the side wall 206 of the computer casing 204 forms a step 222 having a first portion 222a perpendicularly extending from the edge of the side wall 206 and having a dimension substantially corresponding to the predetermined distance between the anchoring tabs 214 and the flat body 208 of the side panel 202. A second portion 222b perpendicularly extends from the first portion 222a. Slots 224 are defined in the first portion 222a of the step 222 for receiving the anchoring tabs 214 of the side panel 202 with the first side edge flange 210 substantially abutting against the first portion 222a of the step 222. The abutting engagement between the first side edge flange 210 of the side panel 202 and the step 222 of the side wall 206 effectively blocking emission of electromagnetic radiation from the computer. The second portion 222b of the step 222 also helps blocking electromagnetic radiation and facilitates guiding the anchoring tabs 214 into the corresponding slot 224.

An elongate locking rod 226 is movably attached to an inside face of a rear wall 228 of the casing 204 for being movable between a lower position and an upper position with respect to the casing 204. The locking rod 226 defines a plurality of openings 230 corresponding to the locking tabs 216 of the side panel 202 and a handle portion 232. The handle portion 232 extends through an opening 233 defined in the rear wall 228 of the casing 202 for being accessed by a user to manually move the locking rod 226.

The rear wall 228 defines a plurality of cutouts 234 corresponding in position to the openings 230 of the locking rod 226 but larger in size than the openings 230 whereby when the side panel 202 is mounted to the casing 204, the locking tabs 216 extend through both the cutout 234 of the rear wall 228 and the openings 230 of the locking rod 226.

A biasing spring 240 is connected between the locking rod 226 and the casing 204 for biasing the locking rod 226 toward the upper position whereby when the locking tabs 216 are inserted into the openings 230 of the locking rod 226, the camming edges 218 interact with the openings 230 and force the locking rod 226 toward the lower position against the spring 240. The biasing force of the spring 240 drives the locking rod 226 back to the upper position after the barbs 220 of the locking tabs 216 pass the openings 230 whereby the openings 230 of the locking rod 226 engage with the retaining recesses 219 of the locking tabs 216 and thus securing the side panel 202 in position.

An extension 250 is formed on the side panel 202 with a through hole 252 defined therein for receiving a bolt (not shown). The bolt may engage with a hole defined in the casing 204 thereby securely fixing the side panel 202 to the casing 204.

Although the present invention has been described with reference to preferred embodiments thereof, it is apparent to those skilled in the art that a variety of modifications and changes that may be made without departing from the scope of the present invention which is intended to be defined by the appended claims.

What is claimed is:

1. A computer casing comprising a side wall defining an opening and a side panel releasably attached to the side wall to close the opening, the side panel having first edge forming engaging means for releasably engaging with a corresponding edge of the opening and an opposite second edge forming a plurality of locking tabs each defining a notch, a locking mechanism comprising a locking rod movable between a locked position and an unlocked position, the locking rod defining a plurality of openings corresponding to cutouts of the casing whereby when the locking rod is moved to the unlocked position, the locking tabs of the side panel are allowed to extend through both the cutouts of the casing and the openings of the locking rod and when the locking rod is moved to the locked position, edges of the openings of the locking rod engage with the notches of the locking tabs thereby securing the side panel in position.

2. The computer casing as claimed in claim 1, wherein the locking mechanism comprises biasing means arranged between the locking rod and the casing for biasing the locking rod to the locked position.

3. The computer casing as claimed in claim 2, wherein each locking tab forms an inclined camming edge for interacting with the edge of the corresponding opening of the locking rod to move the locking rod against the biasing means to the unlocked position.

4. The computer casing as claimed in claim 1, wherein the locking rod forms a handle portion extending beyond the casing for manually moving the locking rod.

5. The computer casing as claimed in claim 1, wherein the engaging means of the first edge of the side panel comprises a flange perpendicularly extending from the side panel and a plurality of outwardly-extending anchoring tabs perpendicularly extending from the flange whereby the tabs are spaced from the side panel, a step is formed on the corresponding edge of the opening of the side wall of the casing comprising a first portion perpendicularly extending from the side wall and a second portion perpendicularly extending from the first portion, slots being defined in the first portion for receiving the anchoring tabs with the flange of the side panel abutting against the first portion of the step of the side wall of the casing.

6. A locking mechanism releasably securing a side panel to a computer casing for covering an opening defined in a side wall of the computer casing comprising a locking rod movable between a locked position and an unlocked position, the locking rod defining a plurality of openings to which cutouts defined in the casing correspond whereby when the locking rod is moved to the unlocked position, locking tabs formed on the side panel are allowed to extend through both the cutouts of the casing and the openings of the locking rod and when the locking rod is moved to the locked position, an edge of each opening of the locking rod engages with a notch defined in the corresponding locking tab thereby securing the side panel in position.

7. The locking mechanism as claimed in claim 6, wherein biasing means is arranged between the locking rod and the casing for biasing the locking rod to the locked position.

8. The locking mechanism as claimed in claim 7, wherein biasing means comprises a spring.

9. The locking mechanism as claimed in claim 7, wherein each locking tab forms an inclined camming edge for interacting with the edge of the corresponding opening of the locking rod to move the locking rod against the biasing means to the unlocked position.

10. The locking mechanism as claimed in claim 6, wherein the locking rod forms a handle portion extending beyond the casing for manually moving the locking rod.

11. The locking mechanism as claimed in claim 6 further comprising a hole defined in the side panel adapted to receive a bolt for securing the side panel to the casing.

12. A computer casing comprising:
   a rear panel defining a plurality of cutouts in a vertical direction;
   a side panel forwardly linearly moveably attached to the casing to cover a side opening of said casing;
   said side panel including a front portion and a rear portion, the front portion forming means for engaging the casing, a plurality of locking tabs extending inwardly and forwardly from the rear portion and horizontally aligned with the corresponding cutouts, respectively; and
   a vertically moveable locking rod positioned inside the rear panel and defining a plurality of openings therealong in said vertical direction while also in horizontal alignment with the corresponding cutouts and locking tabs, respectively; wherein
   said rear panel is sandwiched between the rear portion and said locking rod, and each of said locking tabs extends through both the corresponding aligned cutout and opening under either a locked or an unlocked manner depending upon a vertical position of said locking rod.

* * * * *